United States Patent
Hubbard et al.

(10) Patent No.: US 12,044,719 B2
(45) Date of Patent: Jul. 23, 2024

(54) PROBE CARD FOR DEVICE UNDER TEST

(71) Applicant: TEXAS INSTRUMENTS INCORPORATED, Dallas, TX (US)

(72) Inventors: Trevor Hubbard, Dallas, TX (US); Paul Brohlin, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 279 days.

(21) Appl. No.: 17/724,826

(22) Filed: Apr. 20, 2022

(65) Prior Publication Data

US 2023/0251298 A1  Aug. 10, 2023

Related U.S. Application Data

(60) Provisional application No. 63/307,455, filed on Feb. 7, 2022.

(51) Int. Cl.
| | |
|---|---|
| *G01R 31/12* | (2020.01) |
| *G01R 1/02* | (2006.01) |
| *G01R 1/04* | (2006.01) |
| *G01R 1/067* | (2006.01) |
| *G01R 1/073* | (2006.01) |
| *G01R 1/20* | (2006.01) |
| *G01R 27/26* | (2006.01) |

(Continued)

(52) U.S. Cl.
CPC ..... *G01R 31/2623* (2013.01); *G01R 1/07342* (2013.01)

(58) Field of Classification Search
CPC ........ G01R 31/02; G01R 31/12; G01R 31/26; G01R 31/28; G01R 1/02; G01R 1/04; G01R 1/067; G01R 1/073; G01R 1/20; G01R 27/26
See application file for complete search history.

(56) References Cited

U.S. PATENT DOCUMENTS

| | | |
|---|---|---|
| 6,687,493 B1 | 2/2004 | Sorrells et al. |
| 7,054,296 B1 | 5/2006 | Sorrells et al. |

(Continued)

OTHER PUBLICATIONS

Bahl, et al. "A Generalized Approach to Determine the Switching Lifetime of a GaN FET," 2020 IEEE International Reliability Physics Symposium (IRPS), 2020, pp. 1-6, doi: 10.1109/IRPS45951.2020.9129631.

*Primary Examiner* — Neel D Shah
(74) *Attorney, Agent, or Firm* — Ronald O. Neerings; Frank D. Cimino

(57) ABSTRACT

A probe card with a voltage terminal configured to be coupled to a voltage supply and a current terminal configured to be coupled to a current supply. The voltage terminal and the current terminal are configured to be coupled to an input node of a device under test (DUT) field effect transistor (FET) through probe needles. The probe card has an overlap resistor capacitor (RC) element coupled to the input node. The probe card includes an analog to digital (ADC) voltage capture module configured to be coupled to the input node of the DUT FET and to an output node of the DUT FET through the probe needles. The probe card has a resistive element configured to be coupled to the output node of the DUT FET through the probe needles and to an electrically neutral node and an ADC current capture module coupled in parallel to the resistive element.

20 Claims, 8 Drawing Sheets

(51) Int. Cl.
    *G01R 31/26*     (2020.01)
    *G01R 31/28*     (2006.01)

(56)     References Cited

U.S. PATENT DOCUMENTS

| | | | |
|---|---|---|---|
| 9,476,933 B2 * | 10/2016 | Joh | ............... G01R 31/2621 |
| 10,126,355 B1 | 11/2018 | Ostermaier et al. | |
| 11,067,658 B2 | 7/2021 | Ji et al. | |
| 2014/0295635 A1 | 10/2014 | Sasaki | |
| 2015/0276803 A1 * | 10/2015 | Weimer | ............ G01R 31/2621 |
| | | | 324/762.01 |

* cited by examiner

PROBE CARD FOR DEVICE UNDER TEST

CROSS-REFERENCE TO RELATED APPLICATION

This application claims the benefit of priority to U.S. Provisional Application No. 63/307,455 filed on 7 Feb. 2022, the entirety of which is incorporated herein by reference.

TECHNICAL FIELD

This disclosure relates to probe cards.

BACKGROUND

Automatic test equipment or automated test equipment (ATE) is any apparatus that performs tests on a device, known as the device under test (DUT) using automation to quickly perform measurements and evaluate the test results. In some examples, an ATE is a simple computer-controlled digital multimeter. In other examples, an ATE is a complicated system containing dozens of complex test instruments (real or simulated electronic test equipment) capable of automatically testing and diagnosing faults in sophisticated electronic packaged parts or on wafer testing, including system on chips and integrated circuits.

A wafer prober is used in conjunction with the ATE to test devices that are still in wafer form. A wafer prober handles the wafers so that the wafers are testable by the ATE in a successive fashion. For electrical testing, a set of microscopic contacts for test probes, referred to as a probe card, are held in place whilst the wafer, vacuum-mounted on a wafer chuck, is moved into electrical contact. When a die (or array of dice) have been electrically tested the prober moves the wafer to the next die (or array) and the next test can start. The wafer prober is usually responsible for loading and unloading the wafers from a carrier (or cassette) and is equipped with automatic pattern recognition optics capable of aligning the wafer with sufficient accuracy to ensure accurate registration between contact pads on the wafer and the Ups of the probes.

A probe card is an interface between an electronic test system and a semiconductor wafer. The probe card is mechanically docked to a wafer prober and electrically connected to a tester. The probe card provides an electrical path between the test system and the circuits on the wafer, thereby permitting the testing and validation of the circuits at the wafer level, usually before they are diced and packaged. A probe card is formed with a printed circuit board (PCB) and some form of contact elements, usually metallic, but possibly of other materials as well.

Gallium Nitride (GaN) has a relatively high electron mobility and saturation velocity that enables the employment of GaN for high-power and high-temperature microwave applications. High-power/high-frequency devices based on GaN include microwave radio-frequency power amplifiers (such as those used in high-speed wireless data transmission) and high-voltage switching devices for power grids. More particularly, GaN is employable to fabricate GaN field effect transistors (FETs). As compared with a silicon metal-oxide semiconductor field effect transistor (MOSFET), the GaN FET has a lower drain to source resistance when the GaN FET is on ($R_{DS(ON)}$). GaN FETs have a lower resistance per area than silicon MOSFETs. Also, a GaN FET has lower input capacitance than a MOSFET, such that the GaN FET has a faster on/off switching rate.

SUMMARY

A first example relates to a probe card with a voltage terminal configured to be coupled to a voltage supply and a current terminal configured to be coupled to a current supply. The voltage terminal and the current terminal are configured to be coupled to an input node of a device under test (DUT) field effect transistor (FET) through probe needles. The probe card has a overlap resistor capacitor (RC) element coupled to the input node of the DUT FET and to an electrically neutral node. The probe card includes an analog to digital (ADC) voltage capture module configured to be coupled to the input node of the DUT FET and to an output node of the DUT FET through the probe needles. The probe card also has a resistive element configured to be coupled to the output node of the DUT FET through the probe needles and to an electrically neutral node and an ADC current capture module coupled in parallel to the resistive element.

A second example relates to a probe card that includes a voltage terminal configured to be coupled to a voltage supply and a current terminal configured to be coupled to a current supply. The voltage terminal and the current terminal are configured to be coupled to an input node of a DUT FET mounted on a wafer through probe needles. The probe card has an overlap RC element coupled to an electrically neutral node and to the input node of the DUT FET. The overlap RC element is configured to inject current into the input node of the DUT FET in response to the DUT FET transitioning from a cutoff region to a linear region. The current supply is configured to inject a current into the input node of the DUT FET in response to depletion of the overlap current during an interval of time that the DUT FET is operating in the linear region. The probe card also includes an ADC voltage capture module configured to capture a voltage between an input node and an output node of the DUT FET and a resistive element configured to be coupled to the output node of the DUT FET and to an electrically neutral node through the probe needles. The probe card further includes an ADC current capture module coupled in parallel to the resistive element configured to measure a current across the resistive element. The probe card also includes a driver configured to be coupled to a gate of the DUT FET through the probe needles. The probe card is configured to repeatedly switch the DUT FET from a cutoff region to a linear region while a voltage and current is applied to the input node of the DUT FET.

A third example relates to a method for testing a DUT. The method includes coupling probe needles extending from a probe card to an input port, an output port and a gate of a DUT FET, wherein the DUT FET is embedded in a wafer. The method also includes applying a direct current (DC) voltage to an input node of the DUT FET and to an overlap RC element to charge the RC element. The method further includes switching the DUT FET between a cutoff region and a linear region by applying a time varying signal to a gate of the DUT FET. Current is injected into the input node of the DUT FET from the RC element and voltage is applied to the input node of the DUT FET during time intervals that the DUT FET switches from the cutoff region to the linear region. The method also includes injecting a DC current to the input node of the DUT FET in response to depletion of the current injected by the overlap RC element during an interval of time the DUT FET is operating in the linear region. The method includes measuring, by an ADC voltage capture module of the probe card, a voltage between an input node and an output node of the DUT FET during the switching of the DUT FET. The method yet further includes measuring, by an ADC current capture module of the probe card, coupled in parallel to a resistive element coupled to the output node of the DUT FET and an electrically neutral node, a current through the resistive element during the switching of the DUT FET.

DETAILED DESCRIPTION

Figure 1:
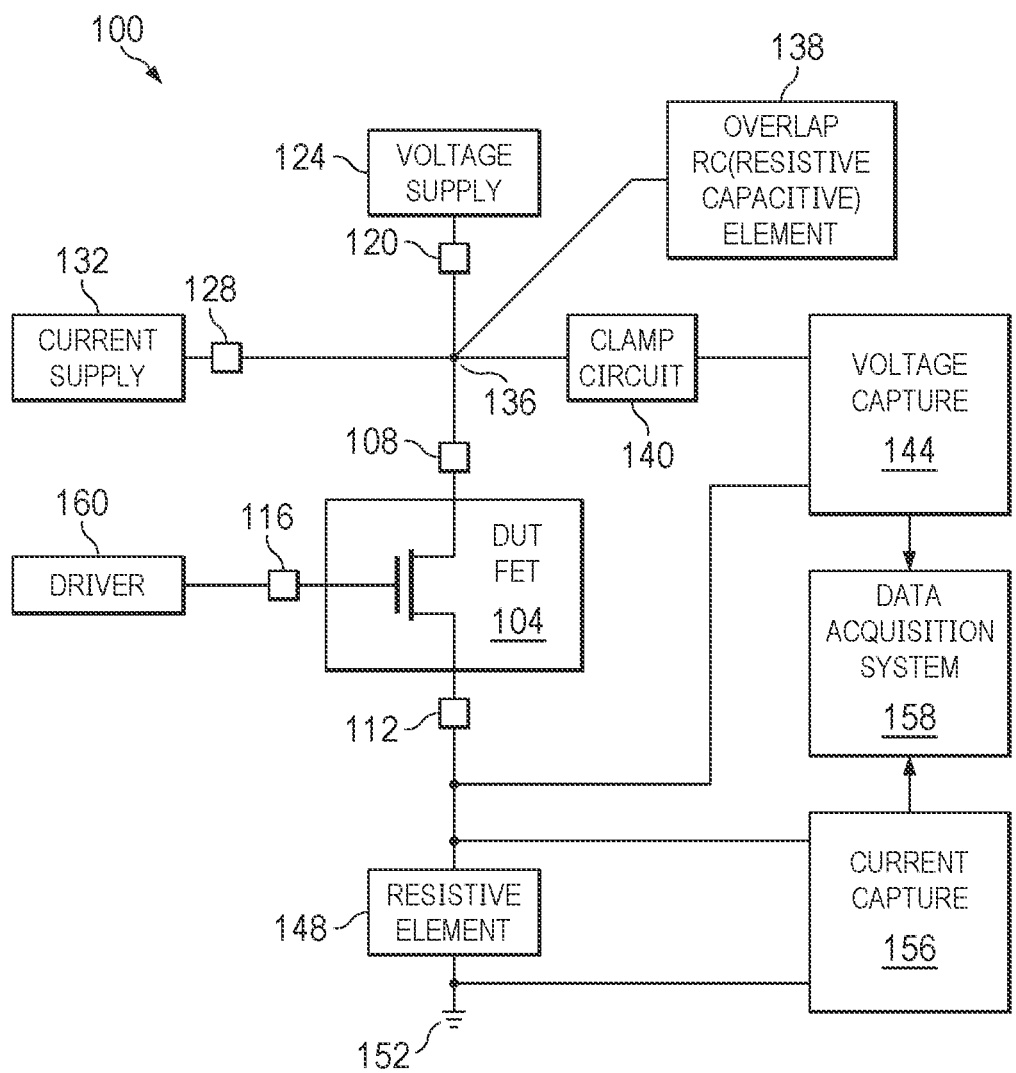
FIG. 1 illustrates a block diagram of a probe card for testing a device under test (DUT) field effect transistor (FET).

This description relates to a probe card for testing a device under test (DUT), such as a gallium nitride (GaN) field effect transistor (FET). The probe card is mounted on automatic test equipment (ATE). More particularly, the probe card is mounted on a wafer prober for testing devices (e.g., FETs) embedded in a wafer. The probe card is implemented as a printed circuit board that is coupled to a power interface board (PIB) of the ATE. The PIB includes a voltage supply and a current supply to provide voltage and current, respectively to the probe card.

The probe card includes a voltage terminal configured to be coupled to the voltage supply on the PIB, and a current terminal configured to be coupled to the current supply on the PIB. The voltage terminal and the current terminal of the probe card are coupled to an input node of the DUT FET. In examples where the DUT FET is implemented with an N-channel FET (NFET), the input node of the DUT FET is a drain of the DUT FET. In examples where the DUT FET is implemented with a P-channel FET (PFET), the input node of the DUT FET is a source of the DUT FET. The probe card includes an analog to digital (ADC) voltage capture module coupled to the input node of the DUT FET and to an output node of the DUT FET through probe needles that extend from the probe card to the wafer containing the DUT FET. In examples where the DUT FET is an NFET, the output node of the DUT FET is a source, and in examples where the DUT FET is a FET the output node of the DUT FET is a drain. The ADC capture module is configured to measure and record a drain to source voltage ($V_{Ds}$) of the DUT FET.

The probe card also includes a resistive element (e.g., a resistor) coupled to the output node of the DUT FET and to an electrically neutral node (e.g., ground) and a ADC current capture module coupled in parallel to the resistive element. The current capture module captures a current through the resistive element, which current is about equal to a drain to source current, IDS of the DUT FET. Unless otherwise stated, in this description, 'about' preceding a value means+/−10 percent of the stated value.

In operation, probe needles extending from the probe card are coupled to the input port, the output port and a control node (e.g., a gate) of the DUT FET. A direct current (DC) voltage from the voltage supply and a DC current from the current supply are applied to the input node of the DUT FET. Moreover, through control of a time varying signal provided to the control node of the DUT FET, the DUT FET is repeatedly switched between a cutoff region and a linear region (e.g., turned off and on). The ADC voltage capture module of the probe card measures a voltage between an input node and an output node of the DUT FET during the switching of the DUT FET, such as a drain to source voltage ($V_{Ds}$). Additionally, the ADC current capture measures a current through the resistive element during the switching of the DUT FET, which corresponds to a drain to source current IDs of the DUT FET.

The ADC voltage capture and the ADC current capture can measure and record a respective $V_{DS}$ and IDS of the DUT FET within about 0.25 microseconds (µs) to about 1 µs of the DUT FET transitioning from the cutoff region to the linear region. Stated differently, the ADC current capture can measure and record a respective $V_{DS}$ and IDS of the DUT FET within about 0.25 µs to about 1 µs each time the DUT FET is turned on. The $V_{DS}$ and IDS of the DUT FET is provided to a data acquisition system. The data acquisition system can employ the $V_{DS}$ and IDS of the DUT FET to determine a drain to source on resistance ($R_{DS(ON)}$) of the DUT FET. The data acquisition system can examine multiple measurements of $R_{DS(ON)}$ to determine if one or more measured instances of $R_{DS(ON)}$ exceeds a threshold level. Additionally or alternatively, the data acquisition system can determine if the $R_{DS(ON)}$ increases beyond a threshold rate as the number of times the DUT FET is switched on. Stated differently, the data acquisition system can determine if the number of times that the DUT FET is switched on causes the $R_{DS(ON)}$ of the DUT FET to increase at a rate that exceeds the threshold rate. In a situation where the $R_{DS(ON)}$ exceeds the threshold level and/or the threshold rate of increase in the $R_{DS(ON)}$ for the DUT FET is exceeded, the data acquisition system can determine that the DUT FET is not operating within acceptable limits, thereby indicating that the DUT FET has failed a performance evaluation test.

FIG. 1 illustrates a block diagram of a probe card 100 for testing a DUT FET 104, such as a GaN FET or other type of FET. The test of the DUT FET 104 is employable to implement a performance evaluation test for determining if the DUT FET 104 is operating within acceptable operational limits. The DUT FET 104 includes an input port 108, an output port 112 and a control port 116. The control port 116 is implemented as a gate of the DUT FET 104. In examples where the DUT FET 104 is implemented as an N-channel FET (NFET), the input port 108 of the DUT FET 104 is implemented as a drain and the output port 112 is implemented as a source. In examples where the DUT FET 104 is implemented as a P-channel FET (PFET), the input port 108 of the DUT is implemented as a source and the output port 112 is implemented as a drain.

The probe card 100 includes a voltage terminal 120 configured to be coupled to a voltage supply 124. In some examples, the voltage supply 124 is implemented as a high voltage direct current (DC) voltage supply that supplies a voltage of about 500 volts (V) to about 1200 V. The probe card 100 also includes a current terminal 128 that is configured to be coupled to a current supply 132. In various examples, the probe card 100 is mounted on a prober interface board (PIB) (e.g., a printed circuit board (PCB)) of an automatic test equipment (ATE). In such examples, the voltage supply 124 and the current supply 132 are integrated with the PIB. In other examples, the probe card 100 is operated independent from the PIB and/or and the ATE.

The input port 108 is coupled to a supply node 136. Thus, the supply node 136 is also coupled to the voltage supply 124 and the current supply 132. Further, an overlap resistive-capacitive (RC) element 138 is coupled to the supply node 136. The overlap RC element 138 provides overlap current during intervals of time where the DUT FET 104 is switching from a cutoff region to a linear region (e.g., turning on). Moreover, the overlap RC element 138 is charged during intervals of time that the DUT FET 104 is operating in the cutoff region. Also, the supply node 136 is coupled to a clamp circuit 140. The clamp circuit 140 is implemented as a voltage limiter for a voltage capture module 144. The voltage capture module 144 is also coupled to the output port 112 of the DUT FET 104. The voltage capture module 144 is implemented as an analog to digital converter (ADC) voltage capture module that measures a voltage between the input port 108 and the output port 112 of the DUT FET 104, namely a drain to source voltage, $V_{DS}$. In some examples, the voltage capture module 144 measures and records the voltage across the input port 108 and the output port 112 at a rate of 10-50 million measurements per second or more, such as about 20 million measurements per second.

The probe card 100 includes a resistive element 148 coupled to the output port 112 of the DUT FET 104 and to an electrically neutral node 152 (e.g., ground). The probe card 100 also includes a current capture module 156 coupled in parallel with the resistive element 148. The current capture module 156 is an ADC current capture module that measures a current across the resistive element 148. Moreover, because the current across the resistive element 148 matches a current between the input port 108 and the output port 112 of the DUT FET 104, the current measured by the current capture module 156 is about equal to the current between the input port 108 and the output port 112, namely a drain to source current, IDS. Stated differently, the current measured by the current capture module 156 is about equal to the current across the DUT FET 104. The voltage capture module 144 and the current capture module 156 can provide data to the data acquisition system 158 of the ATE. In some examples, the current capture module 156 measures and records the current across the input port 108 and the output port 112 at a rate of 10-50 million measurements per second or more.

A driver 160 is coupled to the control port 116 (e.g., gate) of the DUT FET 104. The driver 160 is configured to apply a time varying signal, such as a square wave or a sawtooth wave to the control port 116 of the DUT FET 104. The time varying signal provided from the driver 160 repeatedly switches the DUT FET 104 between a cutoff region and a linear region (or saturation region). That is, the time varying signal provided by the driver 160 repeatedly turns the DUT FET 104 off and on. Further, in response to turning the DUT FET 104 off, the driver 160 is configured to add a delay before turning the DUT FET back on to allow the overlap RC element 138 to recharge.

In operation, the probe card 100 is moved to a position proximal to the DUT FET 104, which is integrated with a wafer in some examples. Connectors, such as probe needles protrude from the probe card 100 to contact the input port 108, the output port 112 and the control port 116 of the DUT FET 104. Moreover, the voltage supply 124 and the current supply 132 provide a constant voltage and current source, respectively, on the input port 108 of the DUT FET 104. Also, the voltage at the voltage supply 124 charges the overlap RC element 138 in response to the DUT FET 104 operating in the cutoff region (e.g., the DUT FET 104 is turned off). The driver 160 applies the time varying signal to the control port 116 to repeatedly switch the DUT FET 104 between the cutoff mode and the linear mode (or saturation mode). Stated differently, the driver 160 repeatedly switches the DUT FET 104 on and off. The voltage capture module 144 is configured to measure and capture the voltage drop between the input port 108 and the output port 112 of the DUT FET 104 while the DUT FET 104 is being turned off (e.g., switching to the cutoff region) and while the DUT FET 104 is being turned on (e.g., switching to the linear region). Similarly, the current capture module 156 is configured to measure and capture the current across the DUT FET 104 while the DUT FET 104 is turning off and while the DUT is turning on. As noted, each measured voltage and current is provided to the data acquisition system 158.

Responsive to receiving the measured voltage and measured current, the data acquisition system 158 determines a drain to source on ($R_{DS(ON)}$) of the DUT FET 104. Moreover, as demonstrated, the DUT FET 104 is switched on and off while a voltage from the voltage supply 124 and a current from the overlap RC element 138 are applied, which is referable to hard switching the DUT FET 104 and/or applying a stress to the DUT FET 104. In some examples, the temperature of the DUT FET 104 is held constant, and in other examples, the temperature of the DUT FET 104 is increased (e.g. up to about 150 degrees Celsius (° C.)).

The data acquisition system 158 is configured to determine if the DUT FET 104 is operating within acceptable operational limits. In particular, in some examples, the data acquisition system 158 is configured to determine if the $R_{DS(ON)}$ of the DUT FET 104 is above a threshold level. Additionally or alternatively, the data acquisition system 158 determines if the $R_{DS(ON)}$ of the DUT FET 104 increases as a function of the number of switches between the on state (operating the linear or saturation region) and the off state (operating in the cutoff region) by a rate that exceeds a threshold rate. Stated differently, the data acquisition system 158 determines if the $R_{DS(ON)}$ of the DUT FET 104 increases under stress from switching the DUT FET 104 beyond the threshold level and/or beyond the threshold rate. Moreover, in some examples, a set number of measurements, such as about 50 to about 150 measurements of the $R_{DS(ON)}$ of the DUT FET 104 are sufficient to determine if the $R_{DS(ON)}$ of the DUT FET 104 exceeds the threshold level and/or the threshold rate. In some examples, such set number of measurements are executed within about 5 seconds or less (e.g., about 2 seconds). If the $R_{DS(ON)}$ of the DUT FET 104 exceeds the threshold level and/or the threshold rate, it is presumed that the $R_{DS(ON)}$ of the DUT FET 104 has failed the performance evaluation. Moreover, the $R_{DS(ON)}$ of the DUT FET 104 might exceed the threshold level and/or the threshold rate due to electron traps within layers of the DUT FET 104 or for other reasons.

By employment of the probe card 100, a relatively quick test of the $R_{DS(ON)}$ of the DUT FET 104 is executed. More particularly, the probe card 100 measures the $R_{DS(ON)}$ of the DUT FET 104 as the overlap current provided from the overlap RC element 138 is injected into the DUT FET 104 and the voltage supply 124 supplies a voltage to the DUT FET 104, such that the DUT FET 104 hot switches between the cutoff region and the linear region. Additionally, in response to the overlap current stored in the overlap RC element 138 depleting, the current supply 132 injects current into the input port 108 of the DUT FET 104 during intervals of time that the DUT FET is operating in the linear region. Also, in some examples, the temperature is held constant (e.g., at a temperature of about 150 degrees Celsius). In some examples, the test of the DUT FET 104 is completable within about 5 seconds or less. In contrast, conventional systems require a relatively slow process using high temperature operating life (HTOL) techniques measuring the $R_{DS(ON)}$ of the DUT FET 104 about 10 milliseconds (ms) or more after switching the DUT FET 104 on. These HTOL techniques conventionally require between about 40 hours and 200 hours to determine if the DUT exceeds the threshold level and/or increases a rate that exceeds the threshold rate.

Figure 2:
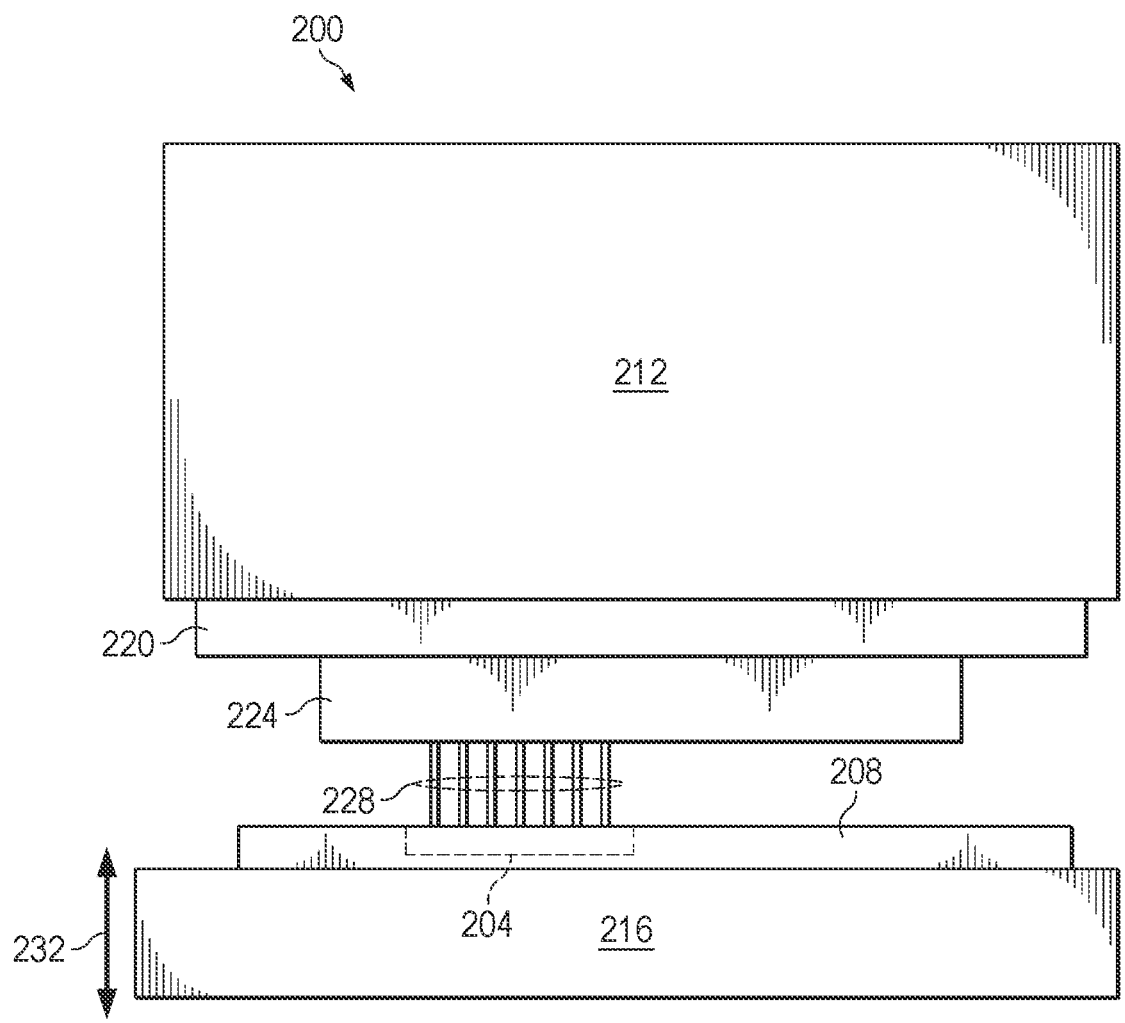
FIG. 2 illustrates a system for testing a DUT FET that is embedded in a wafer.

FIG. 2 illustrates a system 200 for testing a DUT FET 204 that is embedded in a wafer 208. The system 200 includes an ATE with an ATE head 212 and a chuck 216 (e.g., a platform). The system 200 is employable to implement a wafer prober to test the components of the wafer 208. The wafer 208 is situated on the chuck 216 (e.g., with a vacuum mount). In some examples, the chuck 216 is employed to heat the wafer 208. For instance, in such examples, the chuck 216 saturates the wafer 208 with heat to raise a temperature of the wafer (e.g., to about 150 degrees Celsius). A PIB 220 (e.g., a PCB) is mounted on the ATE head 212. In the examples illustrated, a probe card 224 is mounted on the PIB 220, such that the probe card 224 overlies the wafer 208. In other examples, the probe card 224 is implemented independent of the PIB 220 and/or the ATE.

The probe card 224 is implementable with the probe card 100 of FIG. 1. The probe card 224 provides an interface between an electronic test system and a semiconductor wafer containing the DUT FET 204. The probe card 100 is mechanically docked to a wafer prober (e.g., the ATE head 212) and electrically connected to the PIB 220. The probe card 224 provides an electrical path between the PIB 220 and the DUT FET 204, thereby enabling the testing and validation of the DUT FET 204 on the wafer 208, before dicing the wafer. The probe card 100 includes a printed circuit board (PCB) and some form of contact elements, usually metallic, but possibly of other materials as well.

In such a situation, components that provide power, such as the voltage supply 124 and the current supply 132 of FIG. 1 are integrated with the PIB 220. Moreover, in some examples, an interface for the data acquisition system 158 is on the ATE. In other examples, the data acquisition system 158 is implemented as a bench acquisition system. The probe card 224 has a surface that extends parallel to a surface of the wafer 208. Moreover, probe needles 228 extend perpendicularly (normal) from the probe card 224.

The ATE head 212 remains stationary and the chuck 216 moves along an axis 232 in order brings the wafer 208 into contact with the needles 228. More particularly, the chuck 216 to bring the probe needles 228 of the probe card 224 into contact with the DUT FET 204. More particularly, the probe needles 228 establish connections to an input port (e.g., the input port 108 of FIG. 1), an output port (e.g., the output port 112 of FIG. 1) and a control port (e.g., the control port 116 of FIG. 1) of the DUT FET 204. The probe card 224 applies a voltage and current to the DUT FET 204 and measures and records a voltage and current across the DUT FET 204 as the DUT FET 204 is switched from a cutoff region to a linear (or saturation) region in the manner explained herein. The recorded voltage and current is employable by the data acquisition system to calculate an $R_{DS(ON)}$ for the DUT FET 204 within 2 μs of the DUT FET 204 turning on (e.g., switching to the linear region or saturation region). More particularly, the data acquisition system determines if the $R_{DS(ON)}$ for the DUT FET 204 is above a threshold level and/or if the $R_{DS(ON)}$ for the DUT FET 204 increases at a rate that exceeds a threshold rate as the DUT FET 204 is repeatedly turned on.

By employment of the system 200, the probe card 224 has direct access to the input port, the output port and the control port of the DUT FET 204. Moreover, the probe card 224 can repeatedly switch the DUT FET 204 on and off while the DUT FET 204 is under stress (e.g., voltage and current is applied) to reveal defects in the DUT FET 204. Moreover, the test of the DUT FET 204 can be completed in under 5 seconds (e.g., 2 seconds), thereby obviating the need for a much longer test of the DUT FET 204.

Figure 3:
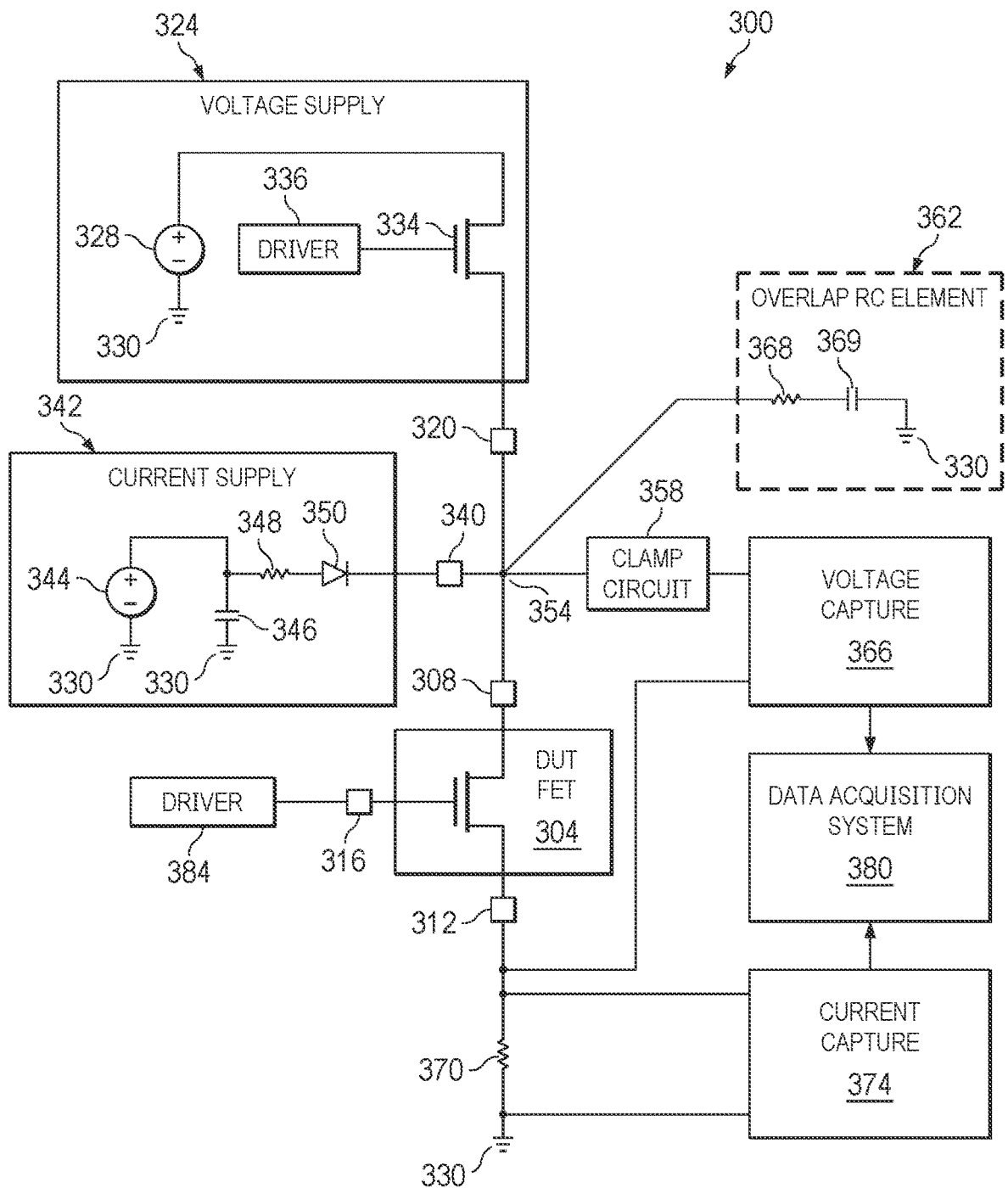
FIG. 3 illustrates a block diagram of a probe card for testing a drain to source on resistance ($R_{DS(ON)}$) of a DUT FET.

FIG. 3 illustrates a circuit diagram of a probe card 300 for testing a drain to source on resistance $R_{DS(ON)}$ of a DUT FET 304, such as a GaN FET or other type of FET. The probe card 300 is employable to implement the probe card 100 of FIG. 1 and/or the probe card 224 of FIG. 2. The probe card 300 is employable to implement a performance evaluation test to determine if the DUT FET 304 is operating within acceptable operational limits. More particularly, the probe card 300 is employable to determine if a drain to source on resistance ($R_{DS(ON)}$) is above a threshold level and/or increases above a threshold rate as the number of times the DUT FET 304 is hard switched on within a given time interval, such that the current supplied by the overlap RC element 362 and the voltage supplied by the voltage supply 324 are injected into the input port 308 of the DUT FET 304 while the DUT FET 304 turns on. The DUT FET 304 includes an input port 308, an output port 312 and a gate 316. In examples where the DUT FET 304 is implemented as an NFET, the input port 308 of the DUT FET 304 is implemented as a drain and the output port 312 is implemented as a source. In examples where the DUT FET 304 is implemented as a PFET, the input port 308 of the DUT FET 304 is implemented as a source and the output port 312 is implemented as a drain.

The probe card 300 includes a voltage terminal 320 configured to be coupled to a voltage supply 324. The voltage supply 324 includes a voltage source, such as a high voltage DC source 328, to supply a voltage of about 500 V to about 1200 V. The high voltage DC source 328 is coupled to an electrically neutral node 330 (e.g., ground). Moreover, the voltage supply 324 includes a high voltage protection FET 334 that is controlled by a driver 336.

The probe card 300 also includes a current terminal 340 that is configured to be coupled to a current supply 342. The current supply 342 includes a voltage source 344 coupled in parallel with a capacitor 346. A negative terminal of the voltage source 344 is coupled to the electrically neutral node 330. A resistor 348 is coupled to a positive terminal of the voltage source 344. The resistor 348 is coupled to a diode 350 that is also coupled to the current terminal 340. In various examples, the probe card 300 is mounted on a PIB (e.g., a PCB) of an ATE head, such as the PIB 220 of FIG. 2. In such examples, the voltage supply 324 and the current supply 342 are integrated with the PIB.

The input port 308 is coupled to a supply node 354. Thus, the supply node 136 is also coupled to the voltage terminal 320 and the current terminal 340. Also, the supply node 354 is coupled to a clamp circuit 358 and to an overlap RC element 362. The clamp circuit 358 is implemented as a voltage limiter for a voltage capture module 366. The overlap RC element 362 includes a resistor 368 coupled to the supply node 354 that is also coupled to a capacitor 369. The capacitor 369 is also coupled to the electrically neutral node 330. The overlap RC element 362 provides overlap current during intervals of time where the DUT FET 304 is switching between a cutoff region and a linear region. Also, as in response to the overlap current from the overlap RC element 362 depleting, the current supply 342 injects current into the input port 308 of the DUT FET 304. More particularly, if the DUT FET 304 is operating in the linear region (or saturation region), a voltage at the supply node 354 decays as the overlap current 362 is depleted. In response to the voltage dropping to a threshold level (e.g., 0.7 V), the diode 350 conducts current, allowing the current supply 342 to inject current into the input port 308 of the DUT FET 304.

The voltage capture module 366 is also coupled to the output port 312 of the DUT FET 304. The voltage capture module 366 is implemented as a ADC voltage capture module that measures a voltage between the input port 108 and the output port 312 of the DUT FET 304. That is, the voltage capture module 366 measures and records a drain to source voltage, $V_{DS}$ of the DUT FET 304. In some examples, the voltage capture module 366 measures and records the voltage across the input port 308 and the output port 312 at a rate of 10-50 million measurements per second or more, such as about 20 million measurements per second.

The probe card 300 includes a resistor 370 (employed to implement the resistive element 148 of FIG. 1) coupled to the output port 312 of the DUT FET 304 and to the electrically neutral node 330 (e.g., ground). The probe card 300 also includes a current capture module 374 coupled in parallel with the resistor 370. The current capture module 374 is an ADC current capture module that measures a current across the resistor 370. Moreover, because the current across the resistor 370 matches a current between the input port 308 and the output port 312 of the DUT FET 304, the current measured by the current capture module 374 is about equal to the current between the input port 308 and the output port 312. Stated differently, the current measured by the current capture module 374 is about equal to the current across the DUT FET 304, namely, the drain to source current, IDS. The voltage capture module 366 and the current capture module 374 can provide data to a data acquisition system 380 of the ATE. In some examples, the current capture module 374 measures and records the current across the input port 308 and the output port 312 at a rate of 10-50 million measurements per second or more.

A driver 384 is coupled to the gate 316 of the DUT FET 304. The driver 384 is configured to apply a time varying signal, such as a square wave or a sawtooth wave to the gate 316 of the DUT FET 304. The time varying signal provided from the driver 384 repeatedly switches the DUT FET 30 between a cutoff region and a linear region (or saturation region). Stated differently, the timing varying signal repeatedly switches the DUT FET 304 on and off.

In operation, the probe card 300 is moved to a position proximal to the DUT FET 304, which is integrated with a wafer in some examples. Connectors, such as probe needles protrude from the probe card 300 to contact the input port 308, the output port 312 and the gate 316 of the DUT FET 304. Moreover, the voltage supply 324 provides a constant voltage on the input port 308 of the DUT FET 304. The driver 384 applies the time varying signal to the gate 316 to repeatedly switch the DUT FET 304 between the cutoff mode and the linear mode (or saturation mode). Stated differently, the driver 384 repeatedly turns the DUT FET 304 on and off. During time intervals where the DUT FET 304 is being turned on, the overlap RC element 362 injects overlap current into the input port 308 of the DUT FET 304. Also, in response to depletion of the overlap current, the current supply 342 injects a constant current (e.g., about 1 A) into the input port 308 of the DUT FET 304. Further, after turning the DUT FET 304 off, the driver 384 is configured to add a delay before turning the DUT FET 304 back on to allow the overlap RC element 362 to recharge. The voltage capture module 366 is configured to measure and capture the voltage drop between the input port 308 and the output port 312 of the DUT FET 304 while the DUT FET 304 is turned off (e.g., operating in the cutoff region and while the DUT FET 304 is turned on (e.g., operating in the linear region). Similarly, the current capture module 374 is configured to measure and capture the current across the DUT FET 304 while the DUT FET 304 is turned off and while the DUT FET 304 is turned on. As noted, each measured voltage and current is provided to the data acquisition system 380.

Responsive to receiving the measured voltage and measured current, the data acquisition system 380 determines a drain to source on resistance ($R_{DS(ON)}$) of the DUT FET 304 within 0.25 μs of the DUT FET 304 transitioning to the linear mode or saturation mode. Moreover, as demonstrated, the DUT FET 304 is switched on and off while a current from the current supply 342 and a voltage from the voltage supply 324 are applied, which is referable to as applying a stress to the DUT FET 304. In some examples, the temperature of the DUT FET 304. For instance, in some examples, the wafer that includes the DUT FET 304 is saturated to a temperature of about 150 degrees Celsius (or other defined temperature) during testing.

The data acquisition system 380 is configured to determine if the DUT FET 104 is operating within acceptable limits. In particular, in some examples, the data acquisition system 380 is configured to determine if the $R_{DS(ON)}$ of the DUT FET 304 is above a threshold level. Additionally or alternatively, the data acquisition system 380 determines if the $R_{DS(ON)}$ of the DUT FET 304 increases as a function of the number of switches between the on state and the off state by a rate that exceeds a threshold rate. Stated differently, the data acquisition system 380 determines if the $R_{DS(ON)}$ of the DUT FET 304 increases under stress from switching the DUT FET 304 beyond the threshold level and/or beyond the threshold rate. Moreover, in some examples, about 50 to about 150 measurements of the $R_{DS(ON)}$ of the DUT FET 304 are sufficient to determine if the $R_{DS(ON)}$ of the DUT FET 304 exceeds the threshold level and/or the threshold rate. If the $R_{DS(ON)}$ of the DUT FET 304 exceeds the threshold level and/or the threshold rate, it is presumed that the $R_{DS(ON)}$ of the DUT FET 304 has failed the performance evaluation. Moreover, the $R_{DS(ON)}$ of the DUT FET 304 might exceed the threshold level and/or the threshold rate due to electron traps within layers of the DUT FET 304 or for other reasons.

Figure 4:
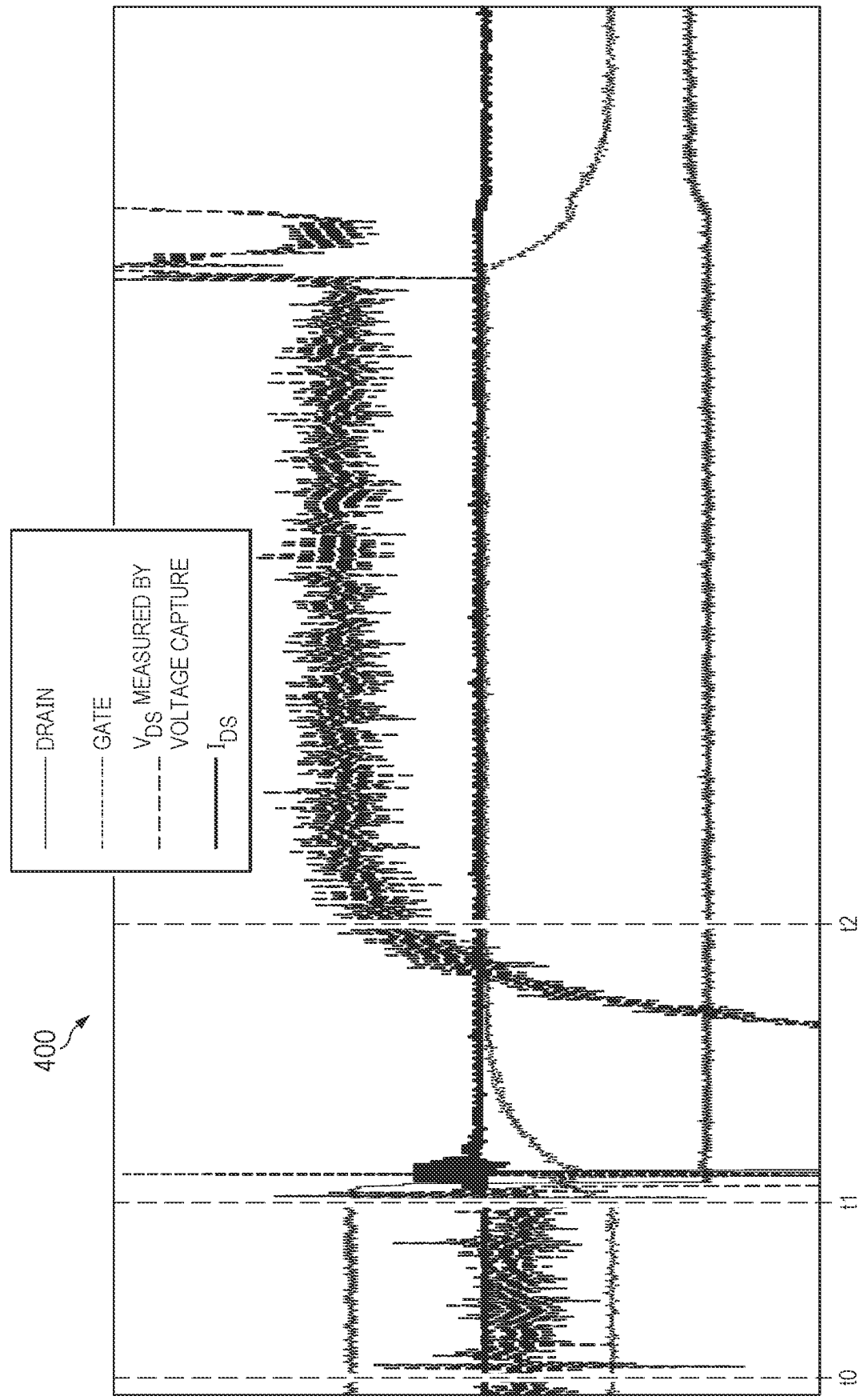
FIG. 4 illustrates an example of a graph that plots voltages of a DUT FET as a function of time.

FIG. 4 illustrates an example of a graph 400 that plots voltages of a DUT FET (e.g., the DUT FET 304 of FIG. 3) as a function of time captured by data acquisition system. More particularly, the graph 400 plots a drain voltage as the DUT FET is turned on, and about 1 KV is applied to the drain of the DUT FET. Additionally, the graph 400 plots the gate voltage, and the drain to source voltage ($V_{DS}$) measured by a voltage capture module (e.g., the voltage capture module 366 of FIG. 3). The graph 400 plots the drain to source voltage current (normalized as a voltage measured across 0.833 ohms, for example the max 22.4 V=~26.88 A of current) measured by a current capture module (e.g., the current capture module 374 of FIG. 3). From time t0 to time t1, the DUT FET is turned off (e.g., cutoff region). At time t1, the gate voltage increases, turning the DET FET on (e.g., linear and saturation regions). As illustrated, between time t0 to time t1, the drain voltage is about 990 V (e.g., about 1 kV), and after time t1, the drain voltage drops to about 250 V. Moreover, the $V_{DS}$ of the DUT FET increases rapidly after time t1 to time t2, and after time t2, the $V_{DS}$ of the DUT FET flattens. Further, after time t1, the IDS of the DUT FET changes rapidly, and then decays to a nearly constant level.

Figure 5:
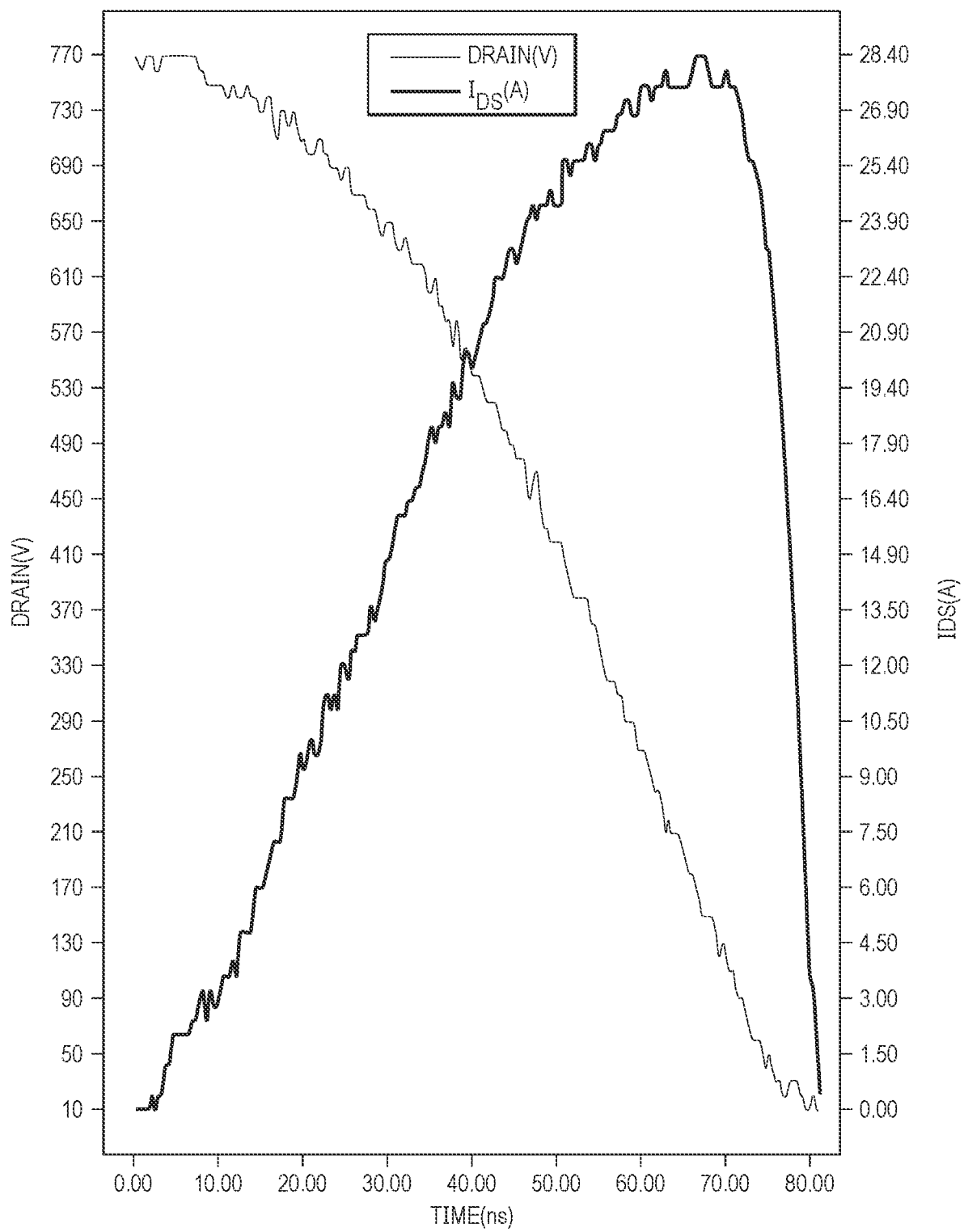
FIG. 5 illustrates an example of a graph that plots drain to source current and a drain voltage of a DUT FET as a function of time.

FIG. 5 illustrates an example of a graph 450 that plots a drain to source drain voltage in volts (V) and drain to source current, IDS in amperes (A) of a DUT FET (e.g., the DUT FET 304 of FIG. 3) as a function of time, in nanoseconds (ns). The graph 450 represents data captured by high resolution measurement equipment, such as an oscilloscope. The time interval represented (0 ns to 80 ns) illustrates a change in the drain voltage and the IDS as the DUT FET is turned on. As illustrated, from time 0 ns to about 75 ns, the IDS increases as the drain voltage decreases. This increase in the IDS as the DUT FET turns on represents overlap current injected by an overlap RC element (e.g., the overlap RC element 138 of FIG. 1). Additionally, from a time of about 75 ns to about 80 ns, the IDS as the DUT FET drops sharply. This drop represents depletion of overlap current stored in the overlap RC element.

By accelerating the current, and voltage of at the DUT FET, namely injecting current and voltage into the input node of the DUT FET while the DUT FET is being turned on, and keeping the temperature relatively high (e.g., 150 degrees Celsius), the drain voltage increases if the DUT FET is faulty as the number of times the DUT FET is switched on and off increases in some examples, which indicates that the $R_{DS(ON)}$ in the DUT FET increases. If the $R_{DS(ON)}$ in the DUT FET increases beyond a threshold value and/or increases at a rate beyond a threshold rate, the DUT FET is considered to failed a performance evaluation.

Figure 6:
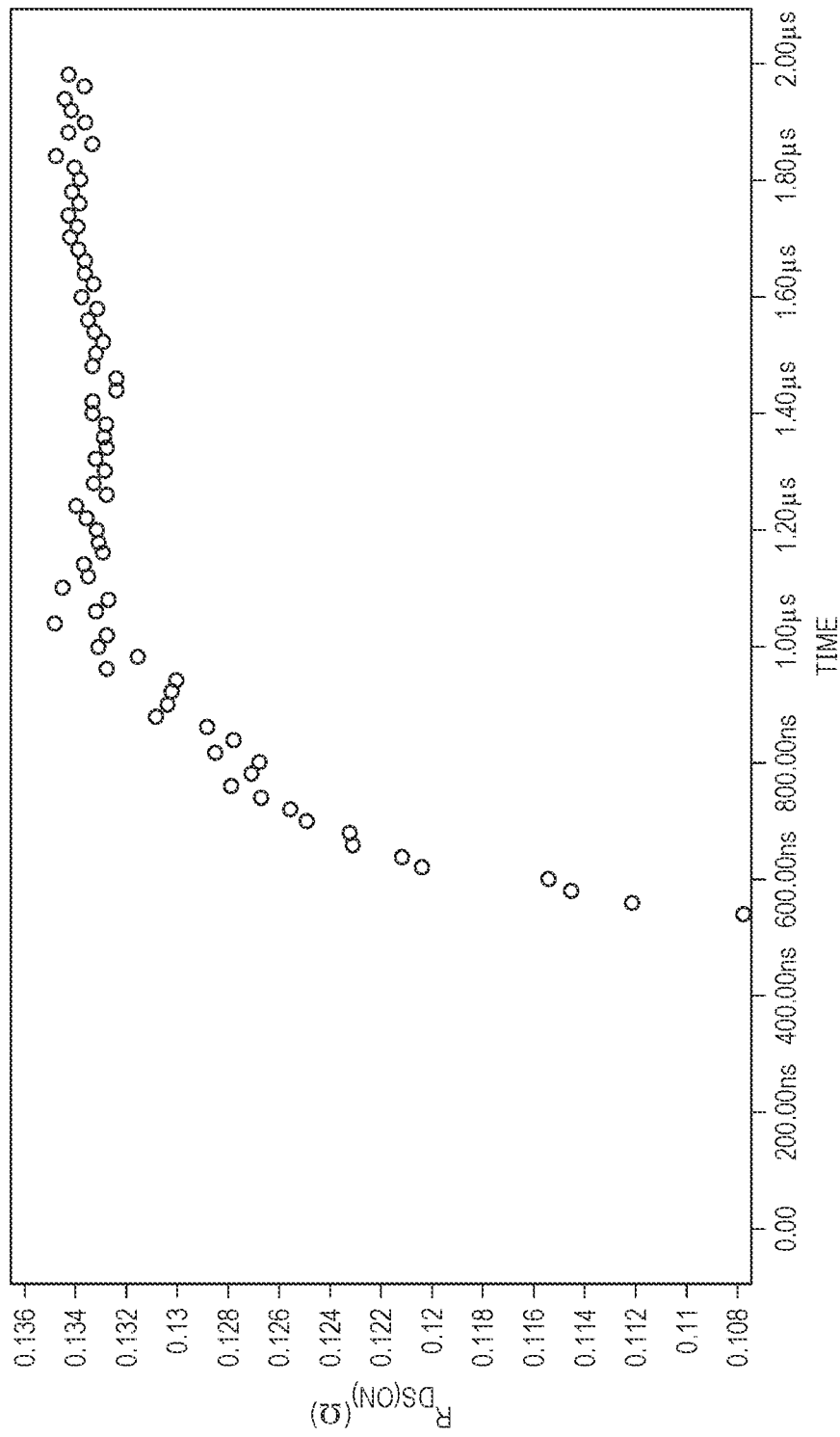
FIG. 6 illustrates an example of a graph that plots a drain to source on resistance, $R_{DS(ON)}$, as observed in a data acquisition system for a DUT FET as a function of time.

FIG. 6 illustrates an example of a graph 500 that plots a drain to source on resistance, $R_{DS(ON)}$, in ohms (Ω) for a DUT FET, such as the DUT FET 304 of FIG. 2 as a function of time, in nanosecond (ns) and microseconds (µs), as observed by a data acquisition system. In the graph 500, voltage is applied to the gate of the DUT FET to turn the DUT FET on at time 0.00. In the example illustrated, it is presumed that the graph 400 corresponds to measurements recorded by the voltage capture module 366 and the current capture module 374 of FIG. 3, such as the output of the graph 400 of FIG. 4. As illustrated, the $R_{DS(ON)}$ for the DUT FET increases from about 0.108Ω to about 0.132Ω from about 600 ns to about 800 ns. Additionally, from about 800 ns to about 2 µs, the $R_{DS(ON)}$ for the DUT FET is relatively flat (stable), measuring between about 0.130Ω and about 0.135Ω.

Figure 7:
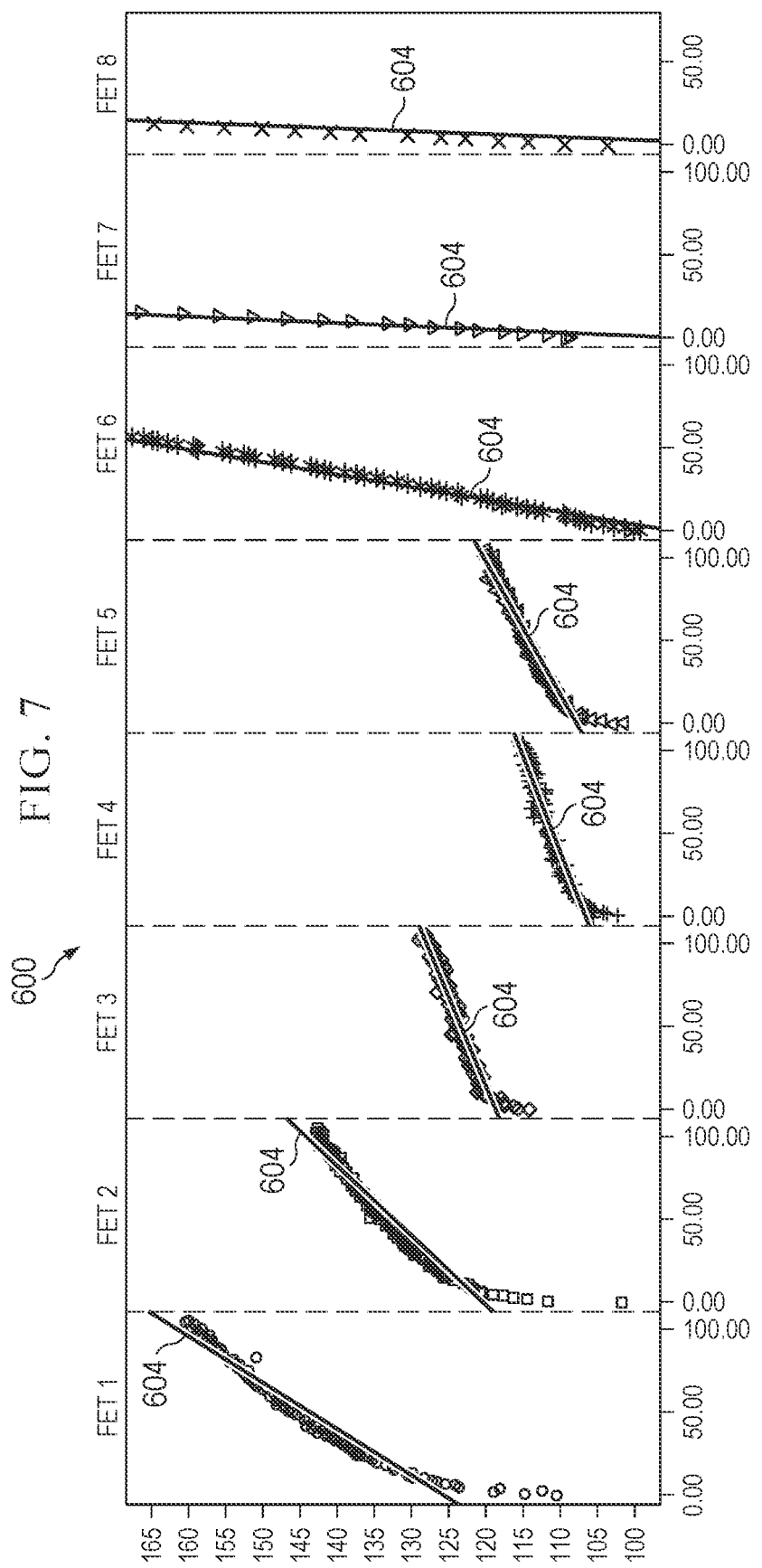
FIG. 7 illustrates a set of graphs that plot measurements of $R_{DS(ON)}$ as a function of an ordinal number of switches from the cutoff region to the linear or saturation region for different DUT FETs.

FIG. 7 illustrates a set of graphs 600 that plot measurements of $R_{DS(ON)}$ as a function of an ordinal number of switches from the cutoff region to the linear or saturation region for different DUT FETs, namely, FETs 1-8 (e.g., different instances of the DUT FET 304 of FIG. 3). Stated differently, each of the set of graphs 600 demonstrates how the $R_{DS(ON)}$ increases as the number of switches increases. Moreover, each graph in the set of graphs 600 includes a slope 604 characterizing a rate of increase in the $R_{DS(ON)}$ as the number of times that the corresponding DUT FET is turned on. A data acquisition system (e.g., the data acquisition system 380 of FIG. 3) can examine data characterizing the set of graphs 600 to determine if the $R_{DS(ON)}$ exceeds a threshold level for any measurement of the $R_{DS(ON)}$. Additionally, the data acquisition system can determine if the rate of increase in $R_{DS(ON)}$ exceeds a threshold rate. As illustrated, the slope 604 varies considerably. Moreover, for a the plots characterizing FETs 6-8, the slope 604 is nearly vertical, which likely indicates that the corresponding DUT FET is not operating within acceptable tolerances. Further, the plots characterizing the FETs 3-5 have a slope 604 that is significantly less, which likely indicates that the corresponding DUT FETs are operating within acceptable operational limits (tolerances). Additionally, each of the graph in the set of graphs 600 can be generated within about 2 seconds. That is, testing of the $R_{DS(ON)}$ for of the FETs 1-8 characterized by the set of graphs 600 is completed within about 2 seconds. For example, each DUT FET needs about 2 second to enable the capture of data, such that it would take about 16 seconds to test 8 DUT FETs.

Referring back to FIG. 3, By employment of the probe card 300, a relatively quick test of the $R_{DS(ON)}$ of the DUT FET 304 is executed. More particularly, the probe card 300 measures the $R_{DS(ON)}$ of the DUT FET 304, and of switches between the cutoff region and the linear region. In some examples, the test of the DUT FET 304 is completable within about 2 seconds (as demonstrated in FIG. 7). In contrast, conventional systems require a relatively slow process using HTOL techniques measuring the $R_{DS(ON)}$ of the DUT FET 304 about 10 milliseconds (ms) or more after switching the DUT FET 104 on. These HTOL techniques conventionally require between about 40 hours and 200 hours to determine if the DUT FET 304 exceeds the threshold level and/or increases a rate that exceeds the threshold rate.

Figure 8:
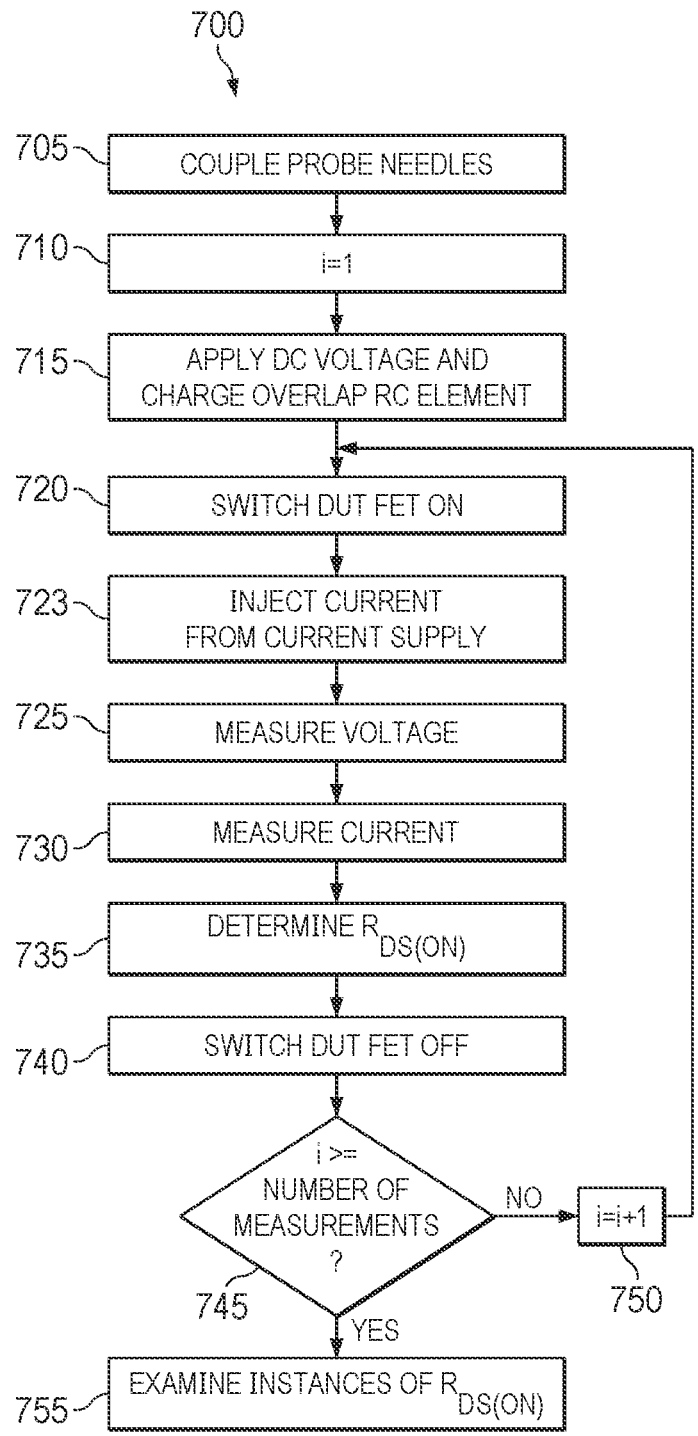
FIG. 8 illustrates a flowchart of an example method for testing a DUT FET.

FIG. 8 illustrates a flowchart of an example method 700 for testing a DUT FET (e.g., the DUT FET 104 of FIG. 1 and/or the DUT FET 304 of FIG. 3). The test is a performance evaluation to determine if the DUT FET is operating with acceptable operational limits. The method 700 is implemented, for example, with the probe card 100 of FIG. 1 and/or the probe card 300 of FIG. 3. At 705, probe needles (e.g., the probe needles 228 of FIG. 1) extending from the probe card are coupled to an input port, an output port and a gate of the DUT FET, wherein the DUT FET is embedded in a wafer (e.g., the wafer 208 of FIG. 2). At 710, a counter variable, i is set to a value of 1. At 715, a DC voltage and are applied to the input node of the DUT FET and an overlap RC element (e.g., the RC element 362 of FIG. 3) is charged in response to the DUT FET operating in the cutoff region (e.g., the DUT FET is turned off). At 720, the DUT FET is switched on by applying a time varying signal to a gate of the DUT FET, thereby switching the DUT FET from a cutoff region to a linear region. At 725 an ADC voltage capture module of the probe card measures a voltage between an input node and an output node of the DUT FET during the switching of the DUT FET, which measured voltage is the drain to source voltage ($V_{Ds}$) of the DUT FET. At 730, an ADC current capture module of the probe card coupled in parallel to a resistive element coupled to the output node of the DUT FET measures a current through the resistive element during the switching of the DUT FET, which current is about equal to the drain to source current (IDs) of the DUT FET.

At 735, a data acquisition system receives the measured $V_{DS}$ and the measured IDS for the DUT FET and records an a drain to source on resistance ($R_{DS(ON)}$) for the DUT FET. At 740, the DUT FET is switched off through the time varying signal applied to the gate of the DUT FET, such that the DUT FET switches from the linear region to the cutoff region.

At 745, a determination is made as to whether the counter variable meets or exceeds a set number of measurements (e.g., 100) for the DUT FET. If the determination at 745 is negative (e.g., NO), the method 700 proceeds to 750. If the determination at 745 is positive (e.g., YES), the method 700 proceeds to 755. At 750, the counter variable, i, is increased by 1 and the method 700 returns to 720. Additionally, in some examples, a delay at 750 (or sometime after 740) is added to allow the overlap RC element to recharge for a next cycle.

At 755, the recorded instances of the $R_{DS(ON)}$ are evaluated by the data acquisition system (or other system). In some examples, the evaluation allows the data acquisition system to determine whether the $R_{DS(ON)}$ of the DUT FET exceeds a threshold level for one or more of the switching iterations. Additionally or alternatively, the evaluation allows the data acquisition system to determine whether $R_{DS(ON)}$ of the DUT FET increases as a function of a number of switches at a rate that exceeds a threshold within a time interval (e.g., 2-5 seconds). If a measured $R_{DS(ON)}$ of the DUT FET exceeds the threshold level and/or the $R_{DS(ON)}$ of the DUT FET exceeds the threshold rate, it is presumed that the DUT FET is not operating within acceptable operational limits, and the DUT FET is considered to have failed the performance evaluation.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. In at least one example, a determination that the DUT is not operating within acceptable operational limits is a determining factor in not approving the DUT for further semiconductor device assembly steps, including subsequent attachment of the DUT to a leadframe, electrical connection to leads of the DUT to leads of the leadframe, and encapsulation of the DUT and leadframe into a packaged semiconductor device. In at least another example, a determination that the DUT is operating within acceptable operational limits is a determining factor in approving the DUT for further semiconductor device assembly steps, including subsequent attachment of the DUT to a leadframe, electrical connection to leads of the DUT to leads of the leadframe, and encapsulation of the DUT and the leadframe into a packaged semiconductor device.

What is claimed is:

1. A probe card comprising:
a voltage terminal configured to be coupled to a voltage supply;
a current terminal configured to be coupled to a current supply, wherein the voltage terminal and the current terminal are configured to be coupled to an input node of a device under test (DUT) field effect transistor (FET) through probe needles;
a overlap resistor capacitor (RC) element coupled to the input node of the DUT FET and to an electrically neutral node;
an analog to digital (ADC) voltage capture module configured to be coupled to the input node of the DUT FET and to an output node of the DUT FET through the probe needles;
a resistive element configured to be coupled to the output node of the DUT FET through the probe needles and to an electrically neutral node; and
an ADC current capture module coupled in parallel to the resistive element.

2. The probe card of claim 1, wherein the DUT FET is embedded in a wafer.

3. The probe card of claim 2, wherein the DUT FET is a gallium nitride (GaN) FET.

4. The probe card of claim 3, wherein the ADC voltage capture module is configured to capture at least 20 million voltage measurements per second and the ADC current capture module is configured to capture at least 50 million current measurements per second.

5. The probe card of claim 4, wherein the ADC voltage capture module and the ADC current capture module are configured to provide data to a data acquisition system of an automatic test equipment (ATE) to measure a drain to source on resistance of the DUT FET.

6. The probe card of claim 5, wherein the ATE further comprises:
an ATE head;
a prober interface board (PIB) mounted on the ATE head, the PIB comprising the voltage supply and the current supply, wherein the probe card is mounted on the PIB, and the probe card overlies the wafer.

7. The probe card of claim 6, wherein the wafer is mounted on a chuck of a wafer prober that is moveable along an axis and the probe needles extend perpendicularly from the probe card to the wafer.

8. The probe card of claim 1, wherein the voltage supply supplies a voltage of at least 1 kilovolt (kV).

9. The probe card of claim 1, wherein the overlap RC element injects current to the input node of the DUT FET in response to the DUT FET switching from a cutoff region to a linear region or saturation region.

10. The probe card of claim 9, wherein the current supply injects a current into the input node of the DUT FET in response to depletion of the current injected by the overlap RC element.

11. The probe card of claim 1, wherein a driver is configured to be coupled to a control node of the DUT FET through the probe needles.

12. A probe card comprising:
a voltage terminal configured to be coupled to a voltage supply;
a current terminal configured to be coupled to a current supply, wherein the voltage terminal and the current terminal are configured to be coupled to an input node of a device under test (DUT) field effect transistor (FET) mounted on a wafer through probe needles;
an overlap resistor capacitor (RC) element coupled to an electrically neutral node and to the input node of the DUT FET, the overlap RC element being configured to inject overlap current into the input node of the DUT FET in response to the DUT FET transitioning from a cutoff region to a linear region, and the current supply is configured to inject a current into the input node of the DUT FET in response to depletion of the overlap current during an interval of time that the DUT FET is operating in the linear region;

an analog to digital (ADC) voltage capture module configured to capture a voltage between an input node and an output node of the DUT FET;

a resistive element configured to be coupled to the output node of the DUT FET and to an electrically neutral node through the probe needles;

an ADC current capture module coupled in parallel to the resistive element configured to measure a current across the resistive element; and a driver configured to be coupled to a gate of the DUT FET through the probe needles, wherein the probe card is configured to repeatedly switch the DUT FET from a cutoff region to a linear region while a voltage and current is applied to the input node of the DUT FET.

13. The probe card of claim 12, wherein the DUT is a gallium nitride (GaN) FET.

14. The probe card of claim 13, wherein the ADC voltage capture module is configured to capture at least 20 million voltage measurements per second and the ADC current capture module is configured to capture at least 20 million current measurements per second.

15. The probe card of claim 14, wherein the ADC voltage capture module and the ADC current capture module are configured to provide data to a data acquisition system of an automatic test equipment to measure a drain to source on resistance of the GaN FET.

16. The probe card of claim 12, wherein the voltage supply supplies a voltage of at least 1 kilovolt (kV) and the overlap RC element is charged by the voltage supply in response to the DUT FET operating in the cutoff region.

17. A method for testing a device under test (DUT), the method comprising:

coupling probe needles extending from a probe card to an input port, an output port and a gate of a DUT field effect transistor (FET), wherein the DUT FET is embedded in a wafer;

applying a direct current (DC) voltage to an input node of the DUT FET and to an overlap resistor capacitor (RC) element to charge the RC element;

switching the DUT FET between a cutoff region and a linear region by applying a time varying signal to a gate of the DUT FET, wherein current is injected into the input node of the DUT FET from the overlap RC element and voltage is applied to the input node of the DUT FET during time intervals that the DUT FET switches from the cutoff region to the linear region;

injecting a DC current to the input node of the DUT FET in response to depletion of the current injected by the overlap RC element during an interval of time the DUT FET is operating in the linear region;

measuring, by an analog to digital (ADC) voltage capture module of the probe card, a voltage between an input node and an output node of the DUT FET during the switching of the DUT FET; and measuring, by an ADC current capture module of the probe card, coupled in parallel to a resistive element coupled to the output node of the DUT FET and an electrically neutral node, a current through the resistive element during the switching of the DUT FET.

18. The method of claim 17, further comprising:
repeating the switching of the DUT FET at least fifty times; and
determining whether a drain to source on resistance of the DUT FET exceeds a threshold for one or more of the switches of the DUT FET.

19. The method of claim 17, further comprising:
repeating the switching of the DUT FET at least fifty times; and
determining whether a drain to source on resistance of the DUT FET increases as a function of a number of switches at a rate that exceeds a threshold.

20. The method of claim 17, wherein the DUT is a gallium nitride (GaN) FET.

* * * * *